(12) United States Patent
Todd

(10) Patent No.: US 7,495,878 B2
(45) Date of Patent: Feb. 24, 2009

(54) DECOUPLING CAPACITOR CONTROL CIRCUIT AND METHOD FOR ENHANCED ESD PERFORMANCE

(75) Inventor: Ronald C. Todd, Amissville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 155 days.

(21) Appl. No.: 11/726,775

(22) Filed: Mar. 22, 2007

(65) Prior Publication Data

US 2008/0232019 A1 Sep. 25, 2008

(51) Int. Cl.
*H02H 3/22* (2006.01)

(52) U.S. Cl. .................... 361/111; 361/56; 361/91.1

(58) Field of Classification Search .................... 361/56, 361/91.1, 111
See application file for complete search history.

(56) References Cited

U.S. PATENT DOCUMENTS

| | | | | |
|---|---|---|---|---|
| 5,506,457 A | * | 4/1996 | Krauter et al. .............. | 307/129 |
| 5,587,685 A | * | 12/1996 | Johansson .................... | 327/546 |
| 5,789,964 A | * | 8/1998 | Voldman ...................... | 327/380 |
| 5,828,259 A | * | 10/1998 | Cases et al. .................. | 327/376 |
| 6,084,464 A | * | 7/2000 | Lin .............................. | 327/525 |
| 6,307,250 B1 | * | 10/2001 | Krauter et al. ............... | 257/532 |

* cited by examiner

*Primary Examiner*—Stephen W Jackson
*Assistant Examiner*—Terrence R Willoughby
(74) *Attorney, Agent, or Firm*—Graybeal Jackson LLP; Paul F. Rusyn (57) ABSTRACT

A decoupling capacitor control circuit is configured to be coupled between supply voltage and reference voltage planes. The control circuit includes a decoupling capacitor having a first node configured to be coupled to the supply voltage plane and having a second node. A first switching element has a first signal node coupled to the second node of the decoupling capacitor and has a second signal node and a control node. A second switching element has a first signal node coupled to the first node of the decoupling capacitor and has a second signal node coupled to the control node of the first switching element, and has a control node. A biasing circuit is coupled to the control nodes of the first and second switching elements. The biasing circuit activates both switching elements when the decoupling capacitor is not defective and deactivates both switching elements when the decoupling capacitor is defective.

20 Claims, 7 Drawing Sheets

DECOUPLING CAPACITOR CONTROL CIRCUIT AND METHOD FOR ENHANCED ESD PERFORMANCE

TECHNICAL FIELD

The present invention relates generally to integrated circuits, and more specifically to electrostatic discharge (ESD) protection for integrated circuits.

BACKGROUND OF THE INVENTION

In electronic devices a supply voltage must be provided to supply power for the associated electronic circuitry to operate. Transients or other types of noise on the supply voltage can result in improper operation of the electronic circuitry. Noise can result from a variety of different sources, such as adjacent electronic circuitry, high power electronic devices where relatively high currents are being switched, or electrostatic discharge ("ESD") events. Regardless of the source of the noise, the noise can introduce transients on the supply voltage of the electronic circuitry that causes improper operation of the electronic circuitry. To prevent such transients from adversely affecting the operation of the electronic circuitry, decoupling capacitors are connected between ground and a supply voltage source that provides the supply voltage. In this way, the decoupling capacitors function as filters to reduce or eliminate spurious transients on the supply voltage which may adversely affect the operation of the electronic circuitry.

In the past, decoupling capacitors were discreet components positioned adjacent to an integrated circuit package (chip) mounted on a printed circuit board, with each decoupling capacitor being positioned adjacent a respective chip. Multiple decoupling capacitors could be positioned adjacent a single chip. The decoupling capacitors were coupled across conductive traces on the printed circuit board supplying ground and the supply voltages to the corresponding chip. These external decoupling capacitors occupied valuable space on the printed circuit board, introduced unwanted inductance in the path of the supply voltage, and required additional manufacturing operations to position and connect the capacitors to the printer circuit board.

Today, decoupling capacitors are commonly fabricated on a semiconductor die along with other electronic components forming the electronic circuitry contained in a given chip. Each chip includes a package that houses the semiconductor die. Because the semiconductor die is contained within the package and since the decoupling capacitors are formed on the die, this type of decoupling capacitor is termed an internal decoupling capacitor in that the capacitors are contained inside the package of the chip. The internal location of the decoupling capacitors helps minimize the effects of ESD events or other transients and noise on the supply voltage that can damage the electronic circuitry of the chip, as will be appreciated by those skilled in the art.

When fabricating internal decoupling capacitors on a semiconductor die, there are typically a relatively large number of such internal decoupling capacitors on each die. As a result, as with all components being formed on a semiconductor die, there is a probability that some of these internal decoupling capacitors will be defective. For example, the internal decoupling capacitors are typically formed using an oxide layer that is formed on the semiconductor die for use in constructing other electronic components contained on the semiconductor die, such as a gate oxide layer for forming metal-oxide-semiconductor ("MOS") transistors. The decoupling capacitors are formed by constructing two conductive plates separated by this oxide layer, which functions as the dielectric of each decoupling capacitor. The oxide layer may be unevenly formed and thus thinner in some regions than in others. If a decoupling capacitor is formed utilizing the oxide of such a thin region, the capacitor may be defective since the undesirably thin oxide may result in a short circuit between the conductive plates of the capacitor. Such a defective capacitor results in an undesirable consumption of power since the defective capacitor presents a short circuit between the supply voltage and ground for the corresponding chip.

If the defective capacitors were to remain connected to the power supply, then the corresponding chip may consume an undesirably high amount of power. This could result in the failure or turning off of a power supply providing power to the chip due to excessive current draw from the power supply. Even where the excess current does not result in the power supply failing or turning off, it could result in an undesirable reduction in the supply voltage that could cause chips on the printed circuit board to operate improperly. Either situation is obviously undesirable, with the turning off or shutting down of the power supply rendering electronic circuitry including the chip unusable and a lower power supply voltage similarly being undesirable since such a lower voltage could compromise the proper operation of the chip, as will be appreciated by those skilled in the art.

Figure 1:
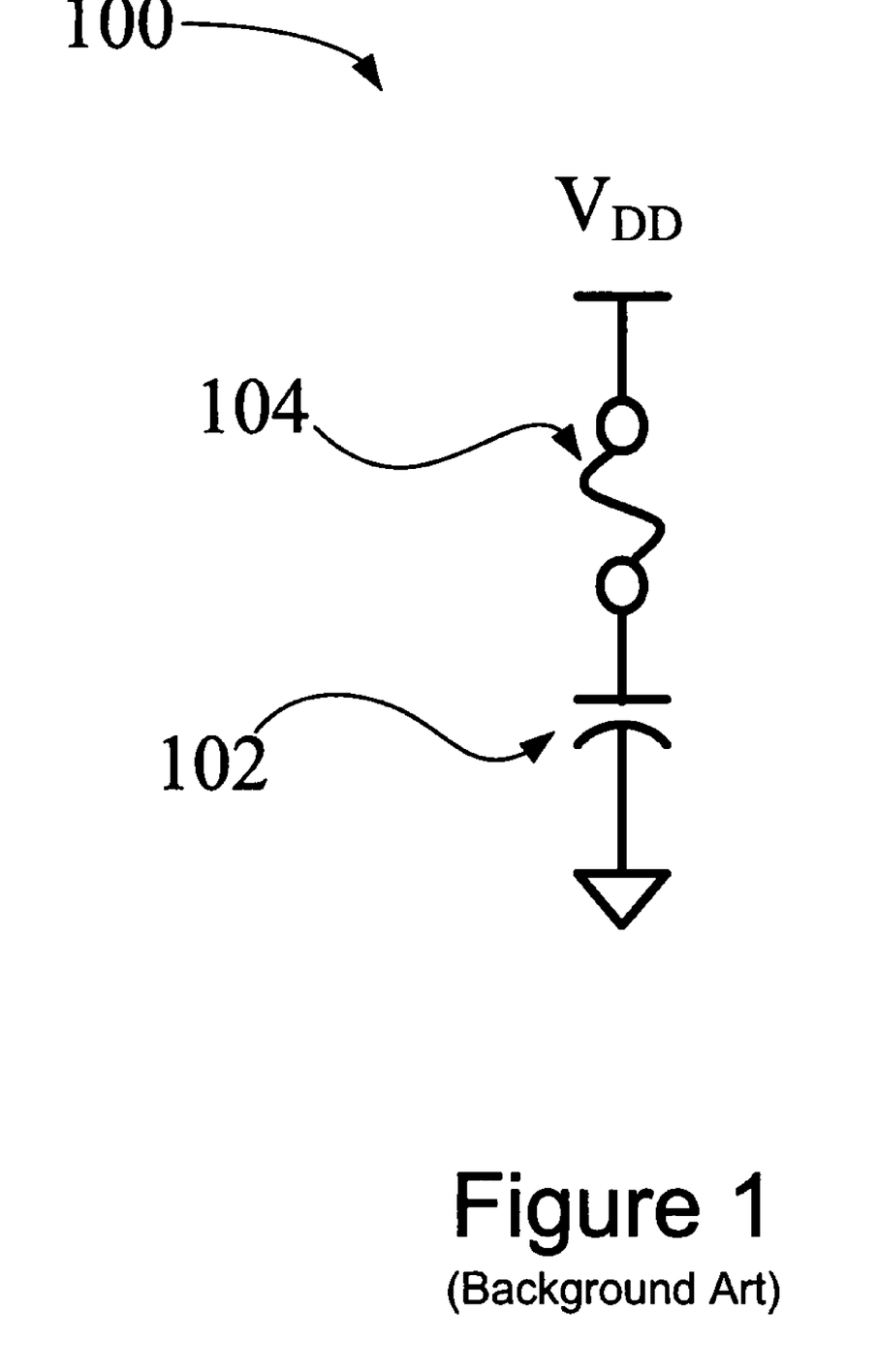
FIG. 1 is a schematic illustrating a conventional fused decoupling capacitor control circuit utilized to prevent defective internal decoupling capacitors from adversely affecting the operation of the associated chip.

Due to these problems presented by defective decoupling capacitors, various prior approaches have been utilized to prevent such defective decoupling capacitors from adversely affecting the operation of the chip and associated components connected to the same power supply. FIG. 1 is a schematic of a conventional fused decoupling capacitor control circuit 100 utilized to prevent a defective internal decoupling capacitor 102 from adversely affecting the operation of an associated chip (not shown) containing the decoupling capacitor. The decoupling capacitor 102 is coupled in series with a fuse 104 between a supply voltage plane that receives a supply voltage Vdd and a reference voltage plane that is coupled to ground. When the decoupling capacitor 102 is not defective, the capacitor and fuse 104 are connected in series between the supply voltage Vdd and ground and the capacitor performs the desired decoupling function and suppresses ESD and noise transients on the supply voltage plane.

When the decoupling capacitor 102 is defective, excessive current flows through the capacitor and fuse 104, resulting in the fuse blowing or opening to thereby isolate the capacitor from the supply voltage Vdd and eliminate current flow through the capacitor. Note that when the decoupling capacitor 102 is defective this defective capacitor is completely and permanently removed from operation in the control circuit 100. This reduces the overall decoupling capacitance of the associated chip, which corresponds to the sum of all the decoupling capacitors 102 coupled in parallel. If enough decoupling capacitors 102 are defective, the overall decoupling capacitance can be reduced to the point that the overall decoupling capacitance no longer adequately protects the chip from, for example, ESD events. More specifically, ESD events may result in transients on the supply voltage such that the reduced overall decoupling capacitance due to defective capacitors 102 may result in inadequate suppression of such transients and thereby result in damage to the associated chip due to the transients.

Figure 2:
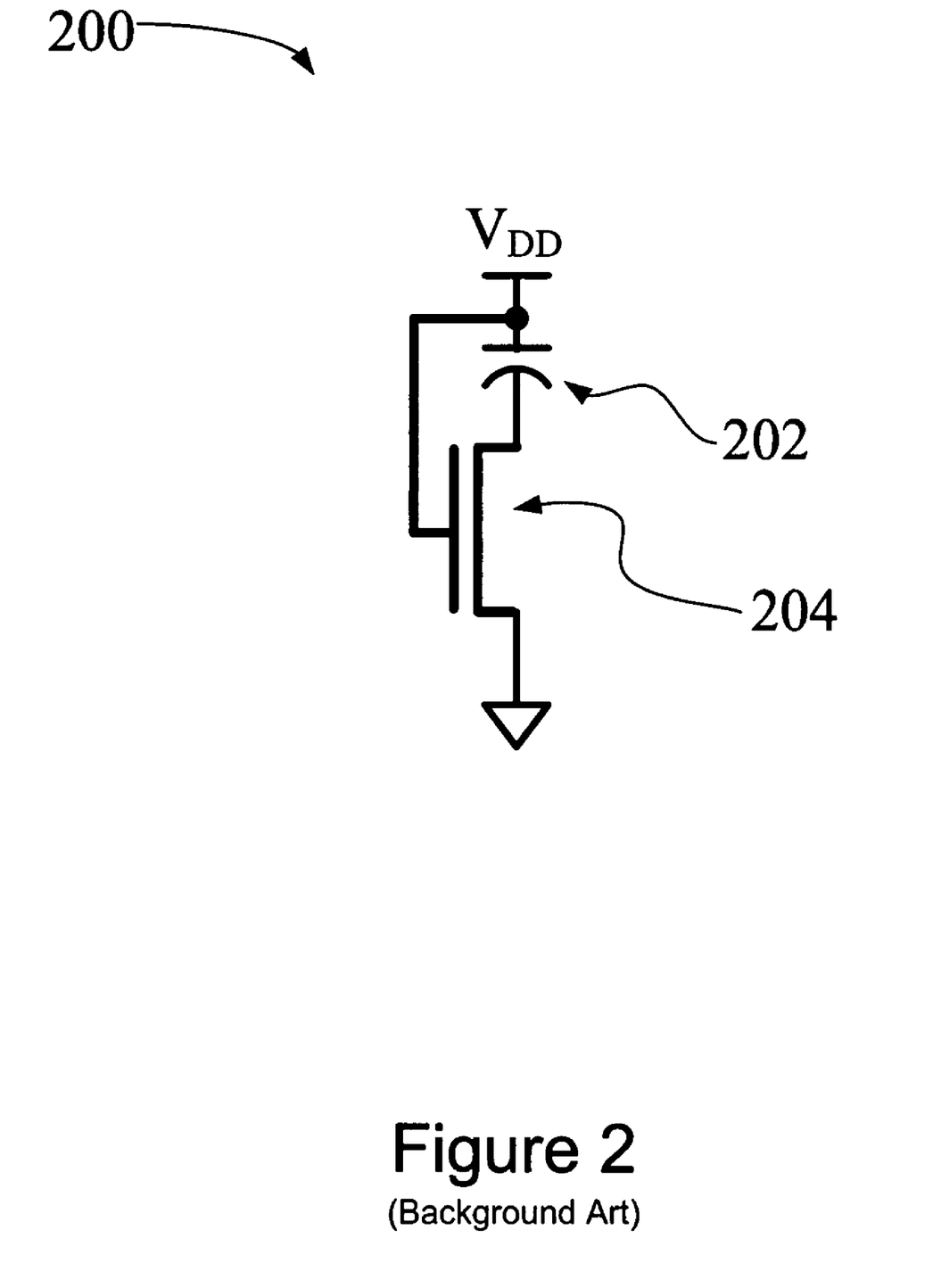
FIG. 2 is a schematic illustrating a conventional current-limited decoupling capacitor control circuit utilized to prevent defective internal decoupling capacitors from adversely affecting the operation of the associated chip.

FIG. 2 is a schematic illustrating a conventional current-limited decoupling capacitor control circuit 200 utilized to prevent a defective internal decoupling capacitor 202 from adversely affecting the operation of an associated chip (not shown). The decoupling capacitor 202 and an NMOS transistor 204 are connected in series between a supply voltage plane that receives a supply voltage Vdd and reference voltage plane that is coupled to ground. When the capacitor 202 is functioning properly, the supply voltage Vdd is applied to the gate of the transistor 204, turning ON the transistor hard so that one terminal of the capacitor 202 is coupled to ground through the transistor. In this way the decoupling capacitor 202 is effectively coupled between the supply voltage Vdd and ground to perform the desired decoupling function. Note that in the present description various components may be said to be coupled to the supply voltage Vdd or ground for ease of description, with one skilled in the art understanding that the component is actually being coupled to the supply voltage plane or reference voltage plane.

When the capacitor 202 is defective, however, the transistor 204 functions like a diode-coupled transistor (i.e., drain coupled to gate via defective decoupling capacitor) to thereby limit the current that flows through the defective decoupling capacitor, with the transistor being sized to limit the current to a desired value. With the current-limited decoupling capacitor control circuit 200, note that the defective decoupling capacitor 202 remains actively connected. This is true because if an ESD event causes a transient on the supply voltage Vdd that increases the value of the voltage on the supply voltage plane, for example, the transistor 204 and defective capacitor 202 allow current to flow through these series-connected components to ground to thereby function to suppress the ESD transient. Moreover, a higher voltage on the supply voltage plane from such a transient results in the transistor 204 turning ON harder, which allows more current flow through the capacitor 202 and transistor 204 to better suppress the transient.

Figure 3:
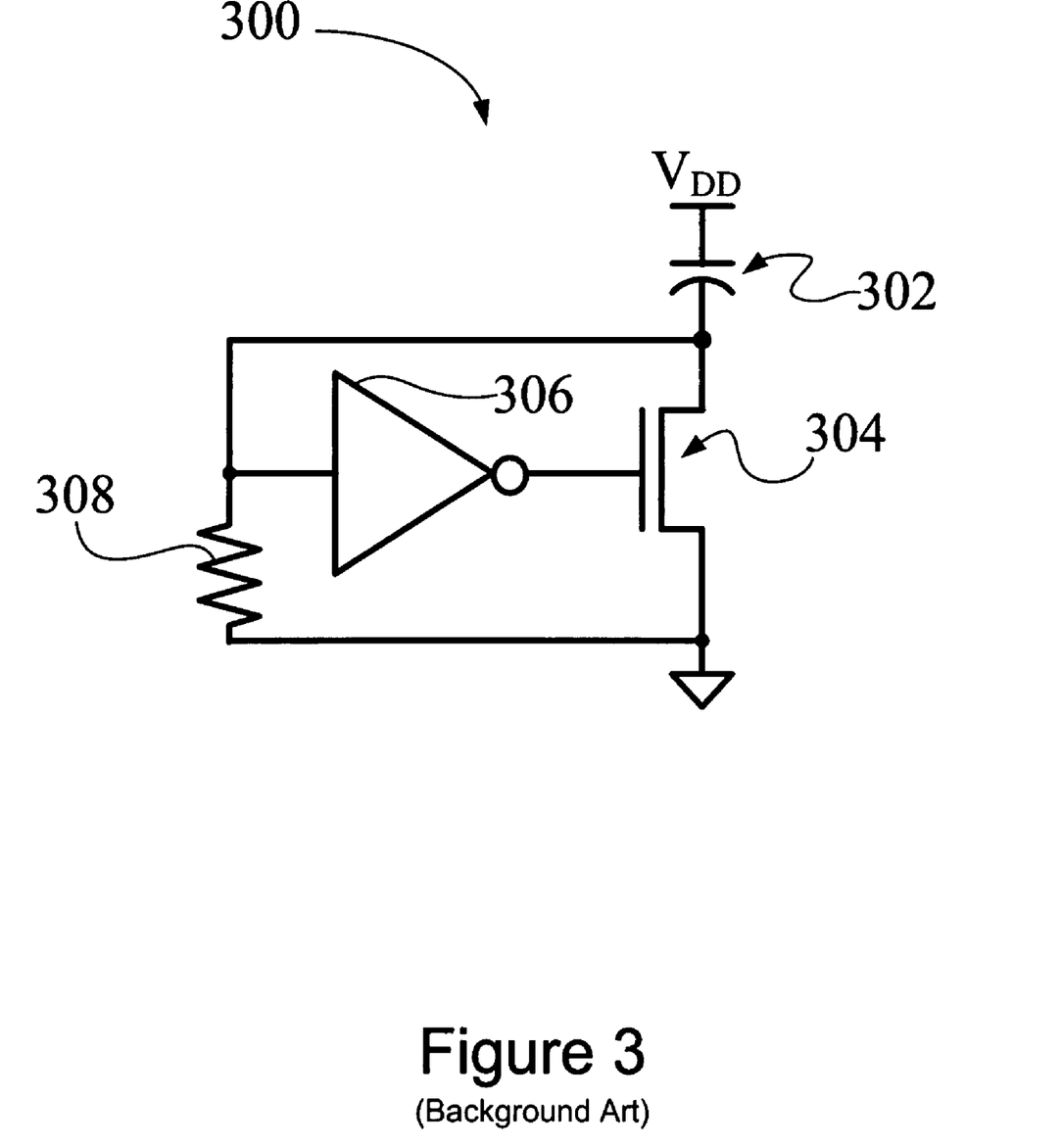
FIG. 3 is a schematic illustrating a conventional active-control decoupling capacitor control circuit utilized to prevent defective internal decoupling capacitors from adversely affecting the operation of the associated chip.

FIG. 3 is a schematic illustrating a conventional active-control decoupling capacitor control circuit 300 utilized to prevent a defective internal decoupling capacitor 302 from adversely affecting the operation of the associated chip (not shown). The active-control decoupling capacitor control circuit 300 includes a decoupling capacitor 302 and an NMOS transistor 304 connected in series between a supply voltage plane that receives a supply voltage Vdd and a reference plane coupled to ground. The control circuit 300 further includes an inverter 306 having its input coupled to the drain of the transistor 304 and its output coupled to the gate of the transistor. A resistor 308 is connected between the input of the inverter and ground to assure that transistor 304 will be turned ON when capacitor 302 is functioning properly.

In operation, when the capacitor 302 is functioning properly the inverter 306 drives its output high, turning ON the transistor 304 and thereby coupling the capacitor 302 between the supply voltage Vdd and ground. The capacitor 302 is at this point coupled to perform its desired decoupling function and suppress ESD and other transients on the supply voltage plane. When the capacitor 302 is defective, however, the voltage at the drain of the transistor 304 increases towards the supply voltage Vdd. When this voltage at the drain exceeds a threshold of the inverter 306, the inverter drives its output low, which turns OFF the transistor 304 and thereby isolates the capacitor 302 from ground to remove the defective capacitor from the circuit.

With the control circuit 300, when the capacitor 302 is functioning properly (i.e., is not defective) an ESD event could trip the inverter 306 such that the inverter drives its output low and thereby turns OFF the transistor 304, even though the capacitor is not defective. This is true because an ESD transient on the supply voltage plane could be bootstrapped through the capacitor 302 to the input of the inverter 306, causing the inverter to drive its output low and thereby turning OFF the transistor 304 as just described. The resistor 308 limits the voltage at the output of the inverter 306 and prevents a large bootstrapped voltage from being developed at the output of the inverter responsive to the bootstrapped voltage at the input of the inverter, which could damage the transistor 304.

Even after the ESD transient has dissipated the inverter 306 can remain turned OFF until the voltage at its input drops below a threshold or trip value of the inverter. The node formed by the interconnection of the drain of transistor 304, input of inverter 306, and one terminal of the capacitor 302 is a capacitive node that will take a finite time to discharge. The time it takes the voltage on this node and thus the voltage at the input of the inverter 306 to reach the threshold value determines how long the capacitor 302 is effectively removed from the circuit and not performing the desired decoupling function. The circuit 300 may undesirably remove good decoupling capacitors 302 from the circuit responsive to an ESD transient, meaning that if a subsequent transient is received while some decoupling capacitors are removed the overall decoupling capacitance of the associated chip is less than its desired value. This reduced overall decoupling capacitance means the magnitude of an ESD transient voltage on the supply voltage plane will have a larger value than if all good decoupling capacitors 302 were properly connected, which could damage circuitry in the chip.

Figure 3A:
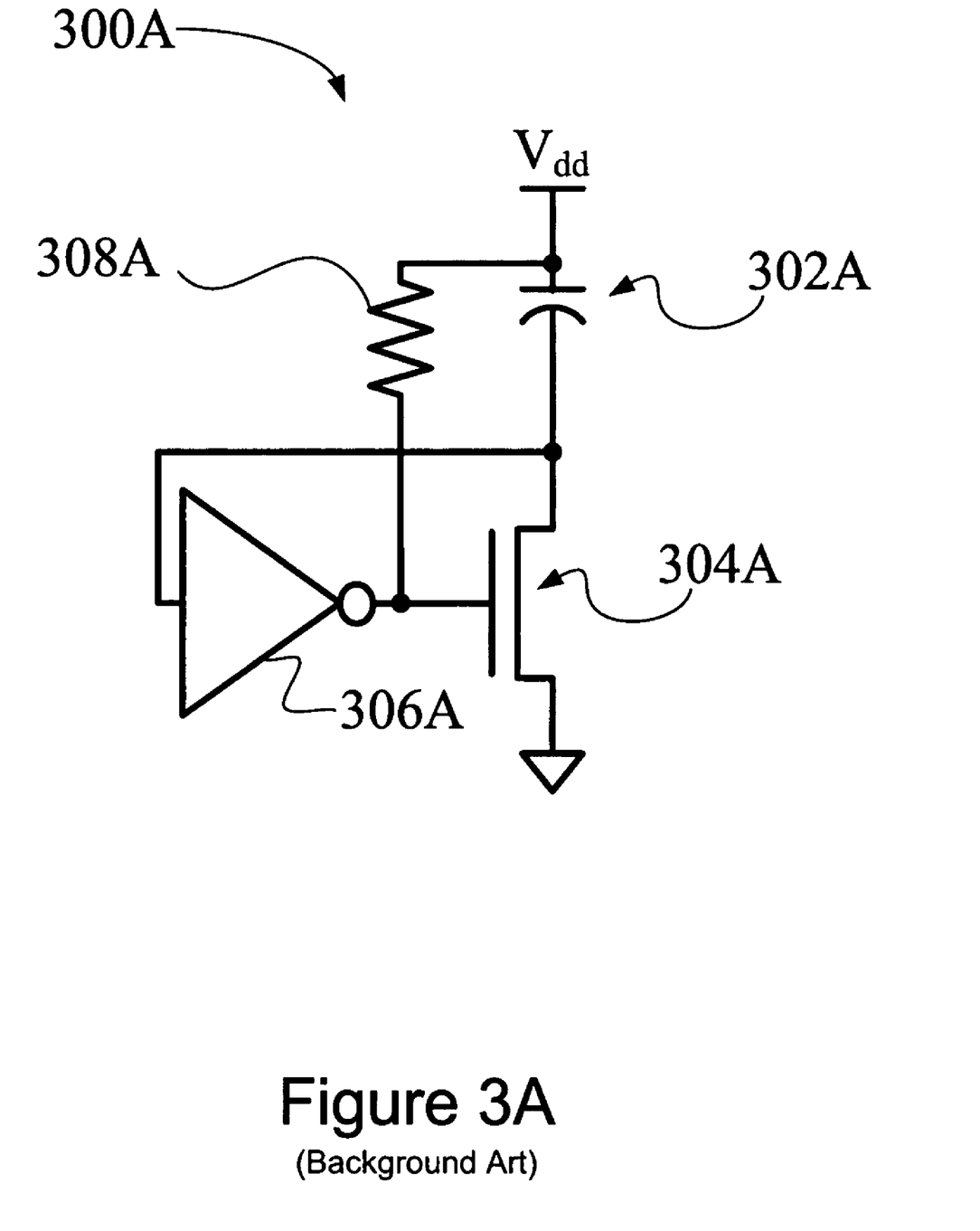
FIG. 3A is a schematic illustrating another conventional active-control decoupling capacitor control circuit utilized to prevent defective internal decoupling capacitors from adversely affecting the operation of the associated chip.

FIG. 3A is a schematic illustrating another conventional active-control decoupling capacitor control circuit 300A utilized to prevent a defective internal decoupling capacitor 302A from adversely affecting the operation of the associated chip (not shown). The circuit 300A is similar to the circuit 300 of FIG. 3 and thus similar components have been given the same reference numbers followed by the designation "A" in FIG. 3A. In the control circuit 300A, a resistor 308A is coupled between the supply voltage plane and the gate of the transistor 304A, in contrast to the resistor 308 of FIG. 3. In operation, when the decoupling capacitor 302A is not defective, the inverter 306A drives its output high, turning ON the transistor 304A and coupling the capacitor 302A between the supply voltage Vdd and ground to provide the desired decoupling function.

When the decoupling capacitor 302A is defective, the voltage at the input to the inverter 306A is sufficiently high to trip the inverter, causing the inverter to drive its output low and thereby turning OFF transistor 304A. A resistor 308A is provided to assure that under steady state conditions with a good capacitor 302A that transistor 304A is turned ON. In practice, however, even though a transient from an ESD event will be transmitted to the gate of the transistor 304A via the resistor 308A this transient may not be sufficient to turn ON the transistor. This is true because the resistor 308A has a relatively high value to limit the voltage at the gate of the transistor 304A and prevent the transistor from being damaged by a transient.

There is a need for a decoupling capacitor control circuit and method that provides reliable operation when the associated decoupling capacitor is defective and functioning properly.

SUMMARY OF THE INVENTION

According to one embodiment of the present invention, a decoupling capacitor control circuit is configured to be coupled between a supply voltage plane and a reference voltage plane. The control circuit includes a decoupling capacitor having a first node configured to be coupled to the supply voltage plane and having a second node. A first switching element has a first signal node coupled to the second node of the decoupling capacitor and has a second signal node and a control node. A second switching element has a first signal node coupled to the first node of the decoupling capacitor and has a second signal node coupled to the control node of the first switching element, and has a control node. A biasing circuit is coupled to the control nodes of the first and second switching elements. The biasing circuit is operable to activate both switching elements when the decoupling capacitor is not defective and is operable to deactivate both switching elements when the decoupling capacitor is defective.

DETAILED DESCRIPTION OF PREFERRED EMBODIMENTS

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention.

Figure 4:
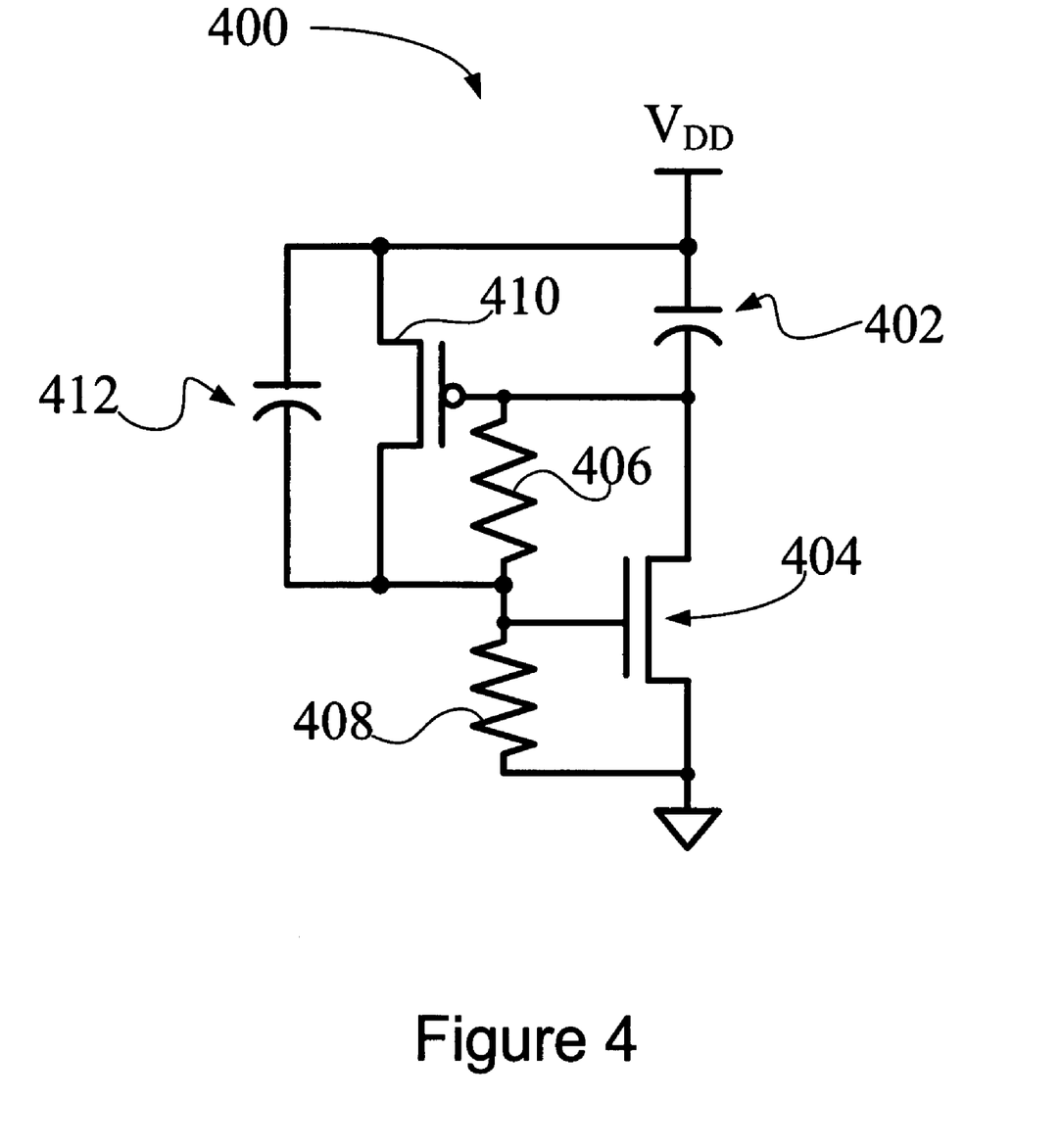
FIG. 4 is a schematic illustrating a decoupling capacitor control circuit that prevents defective decoupling capacitors from adversely affecting the operation of the associated chip according to a first embodiment of the present invention.

FIG. 4 is a schematic illustrating a decoupling capacitor control circuit 400 that prevents a defective decoupling capacitor 402 from adversely affecting the operation of an associated chip (not shown) according to a first embodiment of the present invention. The decoupling capacitor control circuit 400 further includes an NMOS transistor 404 coupled in series with the decoupling capacitor 402 between a supply voltage Vdd and ground. Two resistors 406 and 408 are coupled in series between the drain of the NMOS transistor 404 and ground to form a voltage divider, with a node defined by the interconnection of these two transistors being coupled to the gate of the NMOS transistor. A PMOS transistor 410 is coupled between the supply voltage Vdd and the gate of the NMOS transistor 404, with the gate of the PMOS transistor being connected to the drain of the NMOS transistor. A small capacitor 412 is coupled across the drain and source of the PMOS transistor 410 and functions to enhance ESD performance of the circuit 400, as will be described in more detail below.

When the decoupling capacitor 402 is not defective the gate of the PMOS transistor 410 is at a low voltage through the resistors 406 and 408, which turns ON the PMOS transistor 410. In response to this low voltage at its gate, the PMOS transistor 410 turns ON hard, driving the gate of the NMOS transistor to near the supply voltage Vdd to thereby turn the NMOS transistor 404 on hard. Since the NMOS transistor 404 is turned ON the drain of the NMOS transistor and thus the gate of the PMOS transistor is near ground, which ensures the PMOS transistor 410 is turned ON hard. At this point note that the resistors 406 and 408 are effectively coupled in parallel between the gate of the NMOS transistor 404 and ground. A small current flows in the circuit 400 through these parallel coupled resistors 406 and 408 and has a value determined by the effective parallel resistance presented by these parallel coupled resistors. The resistors 406 and 408 are sized to appropriately bias the transistors 404 and 410 during normal operation of the circuit 400.

In operation, when an ESD or other type of transient occurs on the supply voltage plane, the decoupling capacitor 402 functions as desired to help suppress this transient since the capacitor is effectively coupled between the supply voltage Vdd and ground. In addition, the capacitor 412 functions to couple the transient to the gate of NMOS transistor 404, which causes the NMOS transistor to turn ON even harder so that even more energy from the ESD or other transient is dissipated through the decoupling capacitor 402 and NMOS transistor.

When the decoupling capacitor 402 is defective, the voltage at the drain of the NMOS transistor 404 increases towards the supply voltage Vdd. As a result, the voltage at the gate of the PMOS transistor 410 also increases in the same way towards the supply voltage Vdd, which causes PMOS transistor to become less conductive and eventually turn OFF. As the PMOS transistor turns OFF and the voltage at the drain of the NMOS transistor 404 increases, the voltage across the resistor 406 increases and the voltage across the resistor 408 decreases towards ground. The lower voltage across the resistor 408 means a lower voltage at the gate of the NMOS transistor 404, which causes the NMOS transistor to become less conductive which, in turn, enables the voltage at the drain of the NMOS transistor to further increase towards the supply voltage Vdd. In equilibrium, the voltage at the gate of the PMOS transistor 410 is close enough to the supply voltage VDD to turn OFF this transistor and the voltage at the gate of the NMOS transistor 404 is close enough to ground to turn OFF this transistor. At this point, current flow in the circuit 400 is primarily through the defective decoupling capacitor 402 and series connected resistors 406 and 408, with the value of this current being determined by the resistances presented by each of these components.

In operation, when an ESD or other type of transient occurs on the supply voltage plane and the decoupling capacitor 402 is defective, the capacitor 412 once again couples the ESD or other transient to the gate of NMOS transistor 404. In response to the transient applied to its gate through the capacitor 412, the NMOS transistor 404 turns ON and the defective decoupling capacitor 402 and NMOS transistor function to dissipate energy from the ESD or other transient. In this way, the defective decoupling capacitor 402 is still used as a dissipation element to help suppress transients on the supply voltage plane. The capacitor 412 is sized having a sufficiently small value so that transients on the supply voltage plane are sufficiently coupled to the gate of the NMOS transistor 404 to turn ON this transistor.

In another embodiment of the present invention, the circuit 400 does not include the capacitor 412. With this embodiment, the circuit 400 functions as previously described except for the functionality of the capacitor 412. In this embodiment, also note that if the voltage at the drain of the NMOS transistor 404 increases sufficiently the voltage across the resistor 408 could increase sufficiently to help turn ON the NMOS transistor as well. The decoupling capacitor control circuit 400 uses fewer transistors than the circuits of FIG. 3 and FIG. 3A and is additionally capable of reconnecting a defective capacitor 402 during an ESD event to the circuit to provide additional dissipation of the energy of an ESD impulse.

Figure 5:
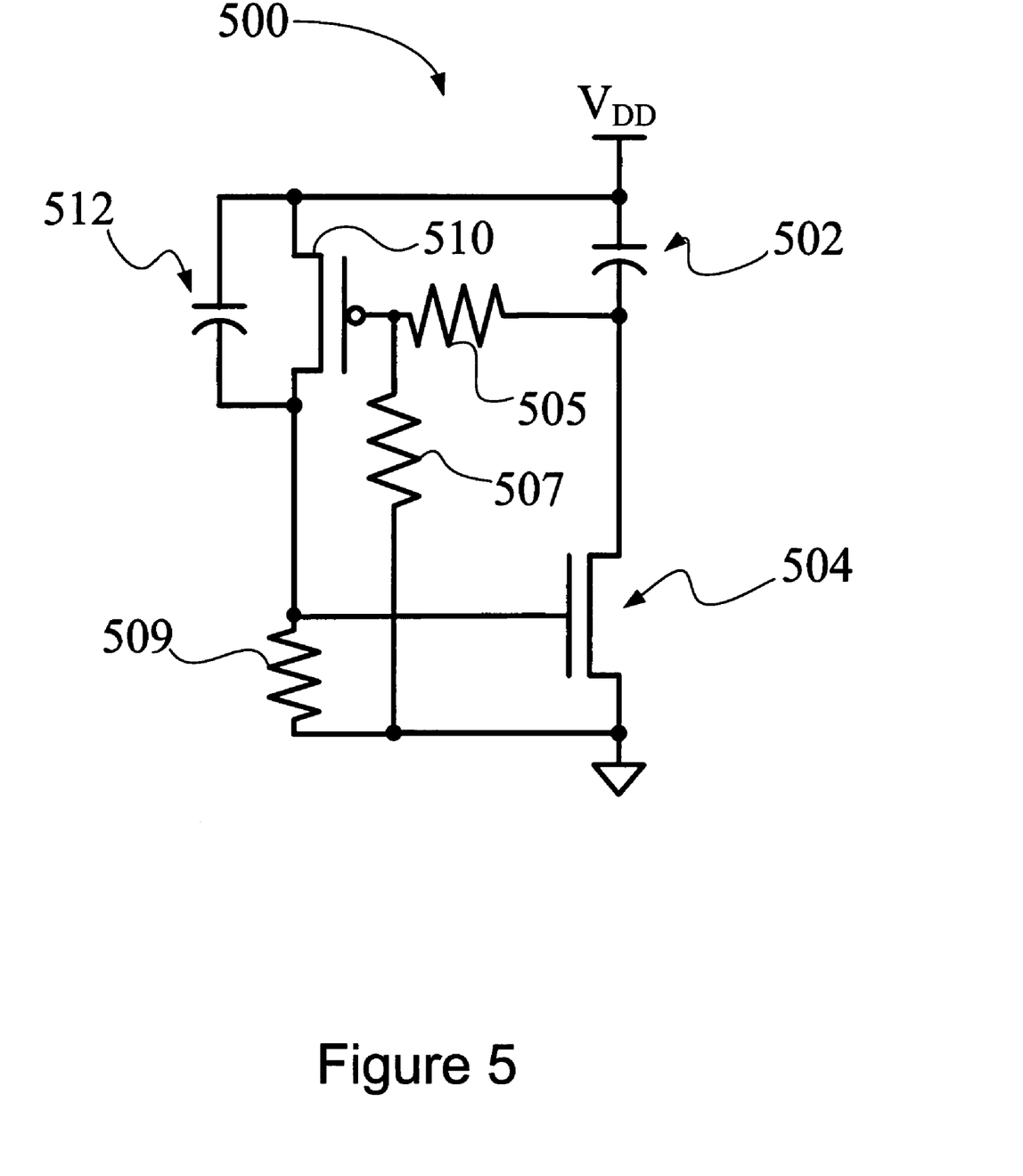
FIG. 5 is a schematic diagram illustrating a decoupling capacitor control circuit that prevents defective decoupling capacitors from adversely affecting the operation of the associated chip according to another embodiment of the present invention.

FIG. 5 is a schematic illustrating a decoupling capacitor control circuit 500 according to another embodiment of the present invention. In this embodiment, a decoupling capacitor 502, NMOS transistor 504, PMOS transistor 510, and capacitor 512 are coupled in the same manner as corresponding components in FIG. 4. The control circuit 500 separates the bias paths for the NMOS transistors 504 and PMOS transistor 510 into two separate paths, which allows for greater flexibility in selecting values for the resistors forming these bias paths and thereby simplifies the design of the control circuit A resistor 505 and a resistor 507 are coupled in series between the drain of the NMOS transistor 504 and ground and function as a voltage divider to bias the gate of the PMOS transistor 510. A node defined at the interconnection of the resistors 505 and 507 is coupled to the gate of the PMOS transistor 510 and applies the bias voltage to this transistor. A resistor 509 is coupled between the drain of the PMOS transistor 510 and ground and the voltage across this resistor corresponds to a bias voltage that is applied to the gate of the NMOS transistor 504 to thereby bias this transistor.

In operation of the control circuit 500, when the decoupling capacitor 502 is not defective, the resistors 505 and 507 forming the first bias path have values that ensure that the voltage applied to the gate of the PMOS transistor 510 fully turns ON this transistor. When the PMOS transistor 510 is fully turned ON, the voltage developed across the resistor 509 forming the second bias path is approximately the supply voltage Vdd so the NMOS transistor 504 is also fully turned ON. Once again, note that in this situation the voltage at the drain of the NMOS transistor 504 is near ground so the resistors 505 and 507 are effectively coupled in parallel between the gate of the PMOS transistor and ground. The resistors 505 and 507 are accordingly sized so that in this situation the voltage developed across these resistors biases the gate of the PMOS transistor 510 to fully turn ON this transistor. Note a small current also flows through the resistor 509 during this mode of operation.

The decoupling capacitor 502 is in this way coupled between the supply voltage Vdd and ground to perform the desired filtering or suppression of transients on the supply voltage plane. When an ESD or other transient occurs on the supply voltage plane, the decoupling capacitor 502 coupled between the supply voltage plane and ground helps suppress this transient. Also note that the capacitor 512 couples the transient to the gate of the NMOS transistor 504, causing the NMOS transistor to turn ON harder so that the circuit 500 dissipates more energy from the transient via the decoupling capacitor 502 and transitor 504.

When the decoupling capacitor 502 is defective, the voltage at the drain of the NMOS transistor 504 increases towards the supply voltage Vdd. In response to this voltage at the drain of the NMOS transistor 504, the bias voltage applied to the gate of the PMOS transistor 510 by the resistors 505 and 507 increases accordingly towards the supply voltage Vdd. As a result, the PMOS transistor 510 becomes less conductive (i.e., is not turned ON as hard) which, in turn, decreases the voltage across the resistor 509. In response to this lower bias voltage at its gate, the NMOS transistor 504 becomes less conductive, allowing the voltage at the drain of the NMOS transistor to increase further towards the supply voltage Vdd. At equilibrium, the voltage at the drain of the NMOS transistor 504 is near the supply voltage Vdd and the NMOS transistor and the PMOS transistor 510 are fully turned OFF. In this situation, the decoupling capacitor 502 is effectively disconnected from between the supply voltage Vdd and ground. The only current flowing in the circuit 500 in this situation is determined by the resistance of the defective decoupling capacitor 502, with a small current flowing through this capacitor and then through the series connected resistors 505 and 507 to ground.

When a transient occurs on the supply voltage plane when the decoupling capacitor 502 is defective, the capacitor 512 once again couples this transient to the gate of NMOS transistor 504, causing this transistor once again to conduct. As a result, even when the decoupling capacitor 502 is defective this decoupling capacitor and NMOS transistor 504 function to filter or suppress transients by dissipating energy of such transients. Note that when the NMOS transistor 504 turns ON responsive to the transient being coupled through the capacitor 512, the voltage at the drain of the NMOS transistor is driven towards ground. As a result, the bias voltage applied to the gate of the PMOS transistor 510 also decreases towards ground and the PMOS transistor turns ON, further driving the voltage at the gate of the NMOS transistor higher, which keeps the NMOS transistor turned ON during the ESD event.

In the control circuit 500, the resistor 509 is made as large as possible so that the bootstrapped transient voltage on the supply voltage plane coupled through the capacitor 512 develops a sufficient voltage across the gate of the NMOS transistor 504 to turn ON this transistor. The value of the resistor 509 cannot be made too large, however, so that leakage currents through the PMOS transistor 510, for example, result in the NMOS transistor 504 turning ON even when no transient is occurring on the supply voltage plane. This would undesirably couple the defective decoupling capacitor 502 between the supply voltage Vdd and ground when no transient is occurring.

Figure 6:
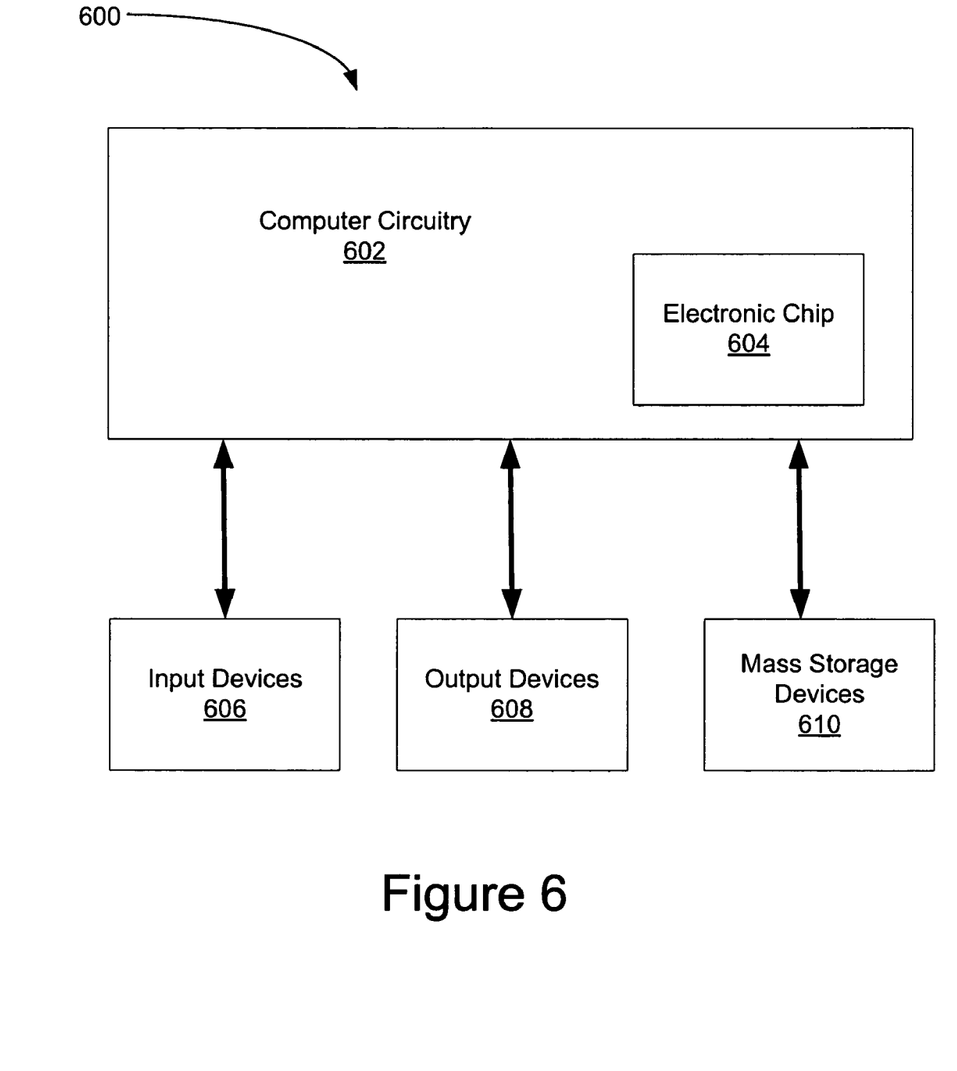
FIG. 6 is a functional block diagram of an electronic system including an electronic chip containing the decoupling capacitor control circuits of FIGS. 4 and/or 5 according to another embodiment of the present invention.

FIG. 6 is a block diagram of an electronic system 600, such as a computer system, including electronic circuitry 602, such as computer circuitry, containing an electronic chip, such as a microprocessor or memory chip, containing the decoupling capacitor control circuit 400 and/or 500. The computer circuitry 602 is coupled to the electronic chip 604 through appropriate address, data, and control buses, and the computer circuitry 602 includes circuitry for performing various computing functions, such as executing specific software to perform specific calculations or tasks. In addition, the computer system 600 includes one or more input devices 606, such as a keyboard or a mouse, coupled to the computer circuitry 602 to allow an operator to interface with the computer system. Typically, the computer system 600 also includes one or more output devices 608 coupled to the computer circuitry 602, such output devices typically including a printer and a video terminal. One or more data storage devices 610 are also typically coupled to the computer circuitry 602 to store data or retrieve data from external storage media (not shown). Examples of typical storage devices 610 include hard and floppy disks, tape cassettes, FLASH memory, compact disk read-only (CD-ROMs) and compact disk read-write (CD-RW) memories, and digital video disks (DVDs).

Even though various embodiments and advantages of the present invention have been set forth in the foregoing description, the above disclosure is illustrative only, and changes may be made in detail and yet remain within the broad principles of the present invention. Moreover, the functions performed by components in the control circuits 400 and 500 may be combined to be performed by fewer elements or separated and performed by more elements in other embodiments of the present invention, as will be appreciated by those skilled in the art. For example, other embodiments of the present invention correspond to the embodiments of FIGS. 4 and 5 but without the capacitors 412 and 512. Also, the drain and source terminals or nodes of the MOS transistors described above are alternatively referred to as signal nodes and the gates of such transistors as control nodes. Different types of transistors may also be used as switching elements in other embodiments of the present invention, such as bipolar junction transistors or gallium arsenide transistors. Therefore, the present invention is to be limited only by the appended claims.

What is claimed is:

1. A decoupling capacitor control circuit configured to be coupled between a supply voltage plane and a reference voltage plane, comprising:
    a decoupling capacitor having a first node configured to be coupled to the supply voltage plane and having a second node;
    a first switching element having a first signal node coupled to the second node of the decoupling capacitor and having a second signal node and a control node;
    a second switching element having a first signal node coupled to the first node of the decoupling capacitor and having a second signal node coupled to the control node of the first switching element, and having a control node; and
    a biasing circuit coupled to the control nodes of the first and second switching elements, the biasing circuit operable to activate both switching elements when the decoupling capacitor is not defective and operable to deactivate both switching elements when the decoupling capacitor is defective.

2. The decoupling capacitor control circuit of claim 1 wherein the first switching element comprises an NMOS transistor.

3. The decoupling capacitor control circuit of claim 1 wherein the second switching element comprises a PMOS transistor.

4. The decoupling capacitor control circuit of claim 1 further comprising a capacitive element coupled across the signal nodes of the second switching element.

5. The decoupling capacitor control circuit of claim 1 wherein the biasing circuit comprises:
    a first resistive element having a first node coupled to the control node of the second switching element and a second node coupled to the control node of the first switching element; and
    a second resistive element having a first node coupled to the control node of the first switching element and a second node configured to be coupled to the reference voltage plane.

6. The decoupling capacitor control circuit of claim 1 wherein the biasing circuit comprises:
    a first resistive element having a first node coupled to the first signal node of the first switching element and having a second node coupled to the control node of the second switching element;
    a second resistive element having a first node coupled to the control node of the second switching element and a second node configured to be coupled to the reference voltage plane; and
    a third resistive element having a first node coupled to the control node of the first switching element and a second node configured to be coupled to the reference voltage plane.

7. The decoupling capacitor control circuit of claim 6 wherein each of the resistive elements comprises a single resistor.

8. An electronic system, comprising:
    input devices;
    output devices;
    storage devices; and
    electronic circuitry coupled to the input, output, and storage devices, the electronic circuitry including an electronic chip, the electronic chip including a decoupling capacitor control circuit configured to be coupled between a supply voltage plane and a reference voltage plane, the decoupling capacitor control circuit comprising:
        a decoupling capacitor having a first node configured to be coupled to the supply voltage plane and having a second node;
        a first switching element having a first signal node coupled to the second node of the decoupling capacitor and having a second signal node and a control node;
        a second switching element having a first signal node coupled to the first node of the decoupling capacitor and having a second signal node coupled to the control node of the first switching element, and having a control node; and
        a biasing circuit coupled to the control nodes of the first and second switching elements, the biasing circuit operable to activate both switching elements when the decoupling capacitor is not defective and operable to deactivate both switching elements when the decoupling capacitor is defective.

9. The electronic system of claim 8 wherein the electronic circuitry comprises computer circuitry.

10. The electronic system of claim 8 wherein the electronic chip comprises a memory device.

11. The electronic system of claim 8 wherein the input devices comprise at least one of a keyboard and a mouse.

12. The electronic system of claim 8 wherein the output devices comprise at least one of a printer and a video terminal.

13. The electronic system of claim 8 wherein the storage devices comprise at least one of a hard disk, floppy disk, tape cassette, FLASH memory, compact disk read-only (CD-ROMs), compact disk read-write (CD-RW) memories, and digital video disk (DVD).

14. The electronic system of claim 8 wherein the first switching element comprises an NMOS transistor and the second switching element comprises a PMOS transistor.

15. The electronic system of claim 8 wherein the decoupling capacitor control circuit further comprises a capacitive element coupled across the signal nodes of the second switching element.

16. A method suppressing transients on first and second voltage planes, the method comprising:
    when a decoupling capacitor is not defective,
        coupling the capacitor between the first and second voltage planes through a series-connected first switching element;
        biasing the first switching element on through a second switching element;
    when the decoupling capacitor is defective,
        deactivating the second switching element to thereby deactivate the first switching element and isolate the capacitor from the second voltage plane;
        coupling a transient on the first voltage plane to the first switching element to thereby activate the first switching element.

17. The method of claim 16 further comprising activating the second switching element responsive to coupling a transient on the first voltage plane to the first switching element to thereby activate the first switching element.

18. The method of claim 16 wherein the first voltage plane is a supply voltage plane and wherein the second voltage plane is a ground plane.

19. The method of claim 16 wherein coupling a transient on the first voltage plane to the first switching element to thereby activate the first switching element comprises capacitively coupling the transient to the first switching element.

20. The method of claim 19 wherein when the decoupling capacitor is not defective a transient on the first voltage plane is coupled to the first switching element.

* * * * *